United States Patent [19]
Brenner et al.

[11] Patent Number: 5,817,569
[45] Date of Patent: Oct. 6, 1998

[54] METHOD OF REDUCING WAFER PARTICLES AFTER PARTIAL SAW

[75] Inventors: Mike Brenner, Dallas; Timothy J. Hogan, Allen; Sean C. O'Brien, Plano; Lawrence D. Dyer; Lisa A. T. Lester, both of Richardson, all of Tex.

[73] Assignee: Texas Instruments Incorporated, Dallas, Tex.

[21] Appl. No.: 855,750

[22] Filed: May 8, 1997

Related U.S. Application Data

[60] Provisional application No. 60/015,107 Apr. 10, 1996.
[51] Int. Cl.⁶ .................................................. H01L 21/46
[52] U.S. Cl. .......................................... 438/460; 438/462
[58] Field of Search ................................. 438/460, 461, 438/462, 463, 464, 465

[56] References Cited

U.S. PATENT DOCUMENTS

| | | | |
|---|---|---|---|
| 4,729,971 | 3/1988 | Coleman | 438/464 |
| 5,061,049 | 10/1991 | Hornbeck | 359/224 |
| 5,079,544 | 1/1992 | DeMond et al. | 340/701 |
| 5,105,369 | 4/1992 | Nelson | 364/525 |
| 5,179,035 | 1/1993 | Shannon | 438/464 |
| 5,278,652 | 1/1994 | Urbanus et al. | 358/160 |
| 5,389,182 | 2/1995 | Mignardi | 156/344 |
| 5,393,706 | 2/1995 | Mignardi et al. | 437/226 |
| 5,435,876 | 7/1995 | Alfaro et al. | 156/247 |
| 5,445,559 | 8/1995 | Gale et al. | 451/388 |
| 5,535,047 | 7/1996 | Hornbeck | 359/295 |
| 5,597,767 | 1/1997 | Mignardi et al. | 437/227 |

*Primary Examiner*—Kevin Picardat
*Attorney, Agent, or Firm*—Julie L. Reed; James C. Kesterson; Richard L. Donaldson

[57] ABSTRACT

A method of fabricating a monolithic device, preferably a micromechanical device, from a wafer (20) by carefully selecting the composition of two or more layers of photoresist (52,54). The present invention comprises choosing compatible photoresist layers to avoid generating defects in the layers of photoresist which could allow a wet chemical HF acid etch process to damage an underlying micromechanical device. The present invention allows a very strong solution of hydrofluoric acid to be utilized to remove particles and debris after a partial-saw process, and to remove a damaged portion of an underlying CMOS layer (22) at a region (68) proximate a kerf (62). Using an HF solution having a concentration of about 6% is desired. The present invention substantially improves the yield of micromechanical devices.

12 Claims, 4 Drawing Sheets

METHOD OF REDUCING WAFER PARTICLES AFTER PARTIAL SAW

CROSS REFERENCE TO RELATED APPLICATION

| SERIAL NO. | TITLE | FILING DATE |
|---|---|---|
| 60/015,107 | Method of Cleaning Wafer After Partial Saw | 04/10/96 |

FIELD OF THE INVENTION

This invention relates generally to a method of manufacturing semiconductor dies from wafers, such as those used for integrated circuits, and more particularly to a method of fabricating a wafer and then cleaning the wafer after a partial saw process, before subsequent processing procedures.

BACKGROUND OF THE INVENTION

Conventional manufacturing techniques mass produce integrated circuit dies from wafers, typically silicon wafers. Each wafer is processed by subjecting the wafer to a series of processes including material deposition and etching procedures to create several integrated circuit dies on the wafer. The wafer is then partitioned and separated along streets to create individual die, typically through a sawing process. These dies are then bonded to leads, and finally packaged in a ceramic or plastic housing to form the final integrated circuit.

In the case of manufacturing micromechanical devices, as well as other devices such as biological or chemical sensors, it is desired to further process the semiconductor wafer after a "partial saw" process, that is, before the wafer is completely diced or cut to form each of the individual die. The partial-saw process is beneficial to initially and accurately cut the wafer along the streets while the wafer is easily registerable with processing equipment, and before the circuit is complete. However, this partial-saw process undesirably generates particles which can contaminate, damage, and possibly render useless, the individual dies if not carefully controlled. Micromechanical devices generally include miniature devices manufactured upon a substrate and have moving parts. Some examples include microaccelerometers, micromotors and gears. These micromechanical devices are particularly vulnerable to particles, and thus the partial-saw process is useful to achieve a partial cut before the moving parts are defined. Clean-up to remove residual debris and particles after the partial-saw process is critical.

A recent innovation of Texas Instruments Incorporated of Dallas Tex., is the digital micromirror device or the deformable mirror device (collectively DMD). The DMD is an electro/mechanical/optical Spatial light modulator (SLM) suitable for use in displays, projectors and hard copy printers. The DMD is a monolithic single-chip integrated circuit SLM, comprised of a high density array of 16 micron square movable micromirrors on 17 micron centers. These mirrors are fabricated and supported over address circuitry including an array of SRAM cells and address electrodes. Each mirror forms one pixel of the DMD array and is bistable, that is to say, stable in one of two positions, wherein a source of light directed upon the mirror array will be reflected in one of two directions. In one stable "on" mirror position, incident light to that mirror will be reflected to a projector lens and focused on a display screen or a photosensitive element of a printer. In the other "off" mirror position, light directed on the mirror will be deflected to a light absorber. Each mirror of the array is individually controlled to either direct incident light into the projector lens, or to the light absorber. The projector lens ultimately focuses and magnifies the modulated light from the pixel mirror array onto a display screen and produce an image in the case of a display. If each pixel mirror of the DMD array is in the "on" position, the displayed image will be an array of bright pixels.

For a more detailed discussion of the DMD device and uses, cross reference is made to U.S. Pat. No. 5,061,049 to Hornbeck, entitled "Spatial Light Modulator and Method"; U.S. Pat. No. 5,079,544 to DeMond, et al, entitled "Standard Independent Digitized Video System"; and U.S. Pat. No. 5,105,369 to Nelson, entitled "Printing System Exposure Module Alignment Method and Apparatus of Manufacture", each patent being assigned to the same assignee of the present invention and the teachings of each are incorporated herein by reference. Gray scale of the pixels forming the image is achieved by pulse-width modulation techniques of the mirrors, such as that described in U.S. Pat. No. 5,278,652, entitled "DMD Architecture and Timing for Use in a Pulse-Width Modulated Display System", assigned to the same assignee of the present invention, and the teachings of which are incorporated herein by reference.

The individual mirrors of the DMD mirror array are easily susceptible to damage from debris including particles generated during the wafer saw and/or break process. Because the DMD is a micromechanical device with movable pixel mirrors, the DMDs fabricated upon a wafer may not be conveniently covered with a protective oxide coating prior to a final saw process as is conventional with other semiconductor processing techniques. Moreover, due to the conductive address electrodes with are positioned below the conductive mirrors, a conductive particle entrapped between the mirror and address electrode could easily short the mirror to the address electrode. Thus, it is particularly important in the case of the DMD to avoid leaving behind any particles during the wafer saw process and clean process.

As disclosed in commonly assigned U.S. Pat. No. 5,435,876 entitled Grid Array Masking Tape Process, one technique to protect the wafer during sawing is to utilize a grid array masking tape over the active surface of the processed wafer. The tape adheres to the wafer along a grid extending between the formed integrated circuits and prevents debris from damaging the active surface during the sawing process. The tape is removed after the saw process and then the photoresist under the mirror layer is undercut by a plasma etch process to form wells under the mirrors, allowing the mirrors to deflect.

Other techniques for processing a wafer to form micromechanical devices are disclosed in commonly assigned U.S. Pat. No. 5,393,706 entitled "Integrated Partial Sawing Process", U.S. Pat. No. 5,445,559, entitled "Wafer-Like Processing after Sawing DMDs", U.S. Pat. No. 5,435,876 entitled "Grid Array Masking Tape Process", and U.S. Pat. No. 5,389,182, entitled "Use of a Saw Frame with Tape as a Substrate Carrier for Wafer Level Backend Processing". The teaching of each of these commonly assigned patents is incorporated herein by reference.

In commonly assigned U.S. patent application Ser. No. 08/369,838 entitled "Separation of Wafer into Die with Wafer-Level Processing", there is disclosed a method of covering the surface of a wafer with a protective coating, whereby separation lines are then inscribed on the top surface of the wafer. These separation lines represent boundaries between die and have a predetermined depth. After the protective coating is removed, the wafer is further processed with at least one more wafer-level process. Finally, the wafer is separated into die along the separation lines. In this patent application, there is taught a method whereby the protective coating maybe accomplished by first spinning-on a layer of photoresist and then depositing a thin oxide layer. This protective layer is later removed during the cleaning step using solvents, solvent streams, or ashing. In addition, a wet etch process can be used to remove a resist material.

One technical challenge encountered during the processing of the DMD is the fact that the micromechanical mirrors and associated support structure are fabricated upon CMOS addressing circuitry. Thus, when the wafer is partially sawn along the streets to form kerfs, oxide particles from the CMOS layer of the wafer are generated, and may become disposed within the kerfs. These oxide particles can also be scattered about and disposed upon the protective layer, as shown in FIG. 1.

Although there are several techniques available for removing this debris including oxide particles, it has now recently been discovered that even after a cleanup process to remove oxide particles from the wafer surface and kerfs, the edges of the buried CMOS layer adjacent the kerfs will continue to generate oxide particles over time, after a clean-up process. It has now been discovered that the subsequent generation of these oxide particles from the CMOS layer is due to the microscopic damage, including cracks, in the CMOS layer walls adjacent these kerfs. Time, vibration and other factors facilitate the continuous release of these microscopic oxide particles from the CMOS layer adjacent the kerfs.

In commonly assigned patent application attorney's docket #TI-20141 entitled Method of Cleaning Wafer After Partial Saw, there is disclosed a method of cleaning a partially processed wafer utilizing a solution consisting of an alkyl glycol, buffered hydrofluoric acid (HF) and deionized water to reduce the subsequent generation of particles after the clean-up process. This method of utilizing an alkyl glycol is effective and allows a dilute concentration HF solution to be utilized without damaging an underlying micromechanical structure.

It is an object of the present invention to provide an improved method of cleaning a semiconductor wafer after a partial saw process, and before subsequent processing, which also substantially reduces or eliminates the subsequent generation of debris, including oxide particles from an underlying CMOS layer, after the post-saw cleanup process. Such a method of reducing the subsequent generation of oxide particles would realize a substantially higher yield of dies, especially those of the micromechanical type including DMD's, but also other integrated circuits and devices that require subsequent processing including chemical or biological sensors.

SUMMARY OF THE INVENTION

The present invention achieves technical advantages as a method of fabricating a monolithic device, preferably a micromechanical device, with compatible layers of photoresist, allowing a very strong solution of hydrofluoric acid (HF) to be used during cleanup after a partial saw process. Two or more layers of photoresist are required to form the micromechanical device. By depositing two layers of photoresist that are compatible with one another, defects or side effects such as microcracks, bubbling and swelling originating in one or the other layer are not formed at the interface between layers or within either layer. This freedom from cracks allows a very strong HF solution to be used to clean and etch away the damaged layer on the oxide proximate a kerf that is exposed when partial sawing is done.

The present invention comprises fabricating a monolithic micromechanical device on a wafer by first partially fabricating the device. A top, middle, and bottom photoresist spacer layer is deposited on the wafer with a micromechanical structure being defined therebetween. Next, the wafer is partially sawed to form kerfs. Thereafter, the wafer is cleansed with a solution of buffered HF having a concentration of at least 1%, preferably having a concentration of about 6%. The top, middle and bottom layers of photoresist are compatible with each other so that side effects are not formed between the layers, which side effects would otherwise allow the HF solution to quickly permeate the top photoresist layer or exposed edges and damage the micromechanical structure.

Preferably, the top layer of photoresist is a protective layer deposited over the fabricated micromechanical device. This top layer of photoresist is preferably cured at a lower temperature than the bottom and middle layers of photoresist, and is also chosen to have sufficient viscosity to achieve proper thickness in order to have sufficient puncture/penetration strength. Thus, the choice of photoresist layer materials is crucial. By carefully selecting the materials for the photoresist layers, side effects such as cracking, bubbling or swelling in or at the interface of the photoresist layers is avoided. With a defect-free stack of the top, middle and bottom photoresist layers, a very strong solution of hydrofluoric acid can be utilized during the clean-up step after the partial saw process without damaging the underlying micromechanical structure.

In the preferred embodiment of the present invention, the bottom layer is JSR PFR1X710-D75, the middle layer of photoresist is identified as PFI26B8 made by Sumitomo Chemical America, and the top layer of photoresist is identified as Shipley resist #1813. An alternative combination comprises the bottom layer of photoresist identified as PFRIX710-D75, the middle layer as PFR1X300-D75 and the upper layer comprising PFR1X710-D75, both manufactured by JSR MicroElectronics. These combinations are set forth as preferred combinations, however, limitations to these specific combinations is not to be inferred. Rather, the present invention encompasses carefully choosing the materials for at least two photoresist spacer layers such that no defects or side effects are created in or between the photoresist layers during deposition of the photoresist layers. Each of the layers of photoresist is preferably UV cured to form a hard layer. Other monolithic devices including CCD devices, sensors, accelerometers etc. that are sensitive to particles can also be manufactured according to the present invention.

DETAILED DESCRIPTION OF THE PREFERRED EMBODIMENT

Figure 1A:
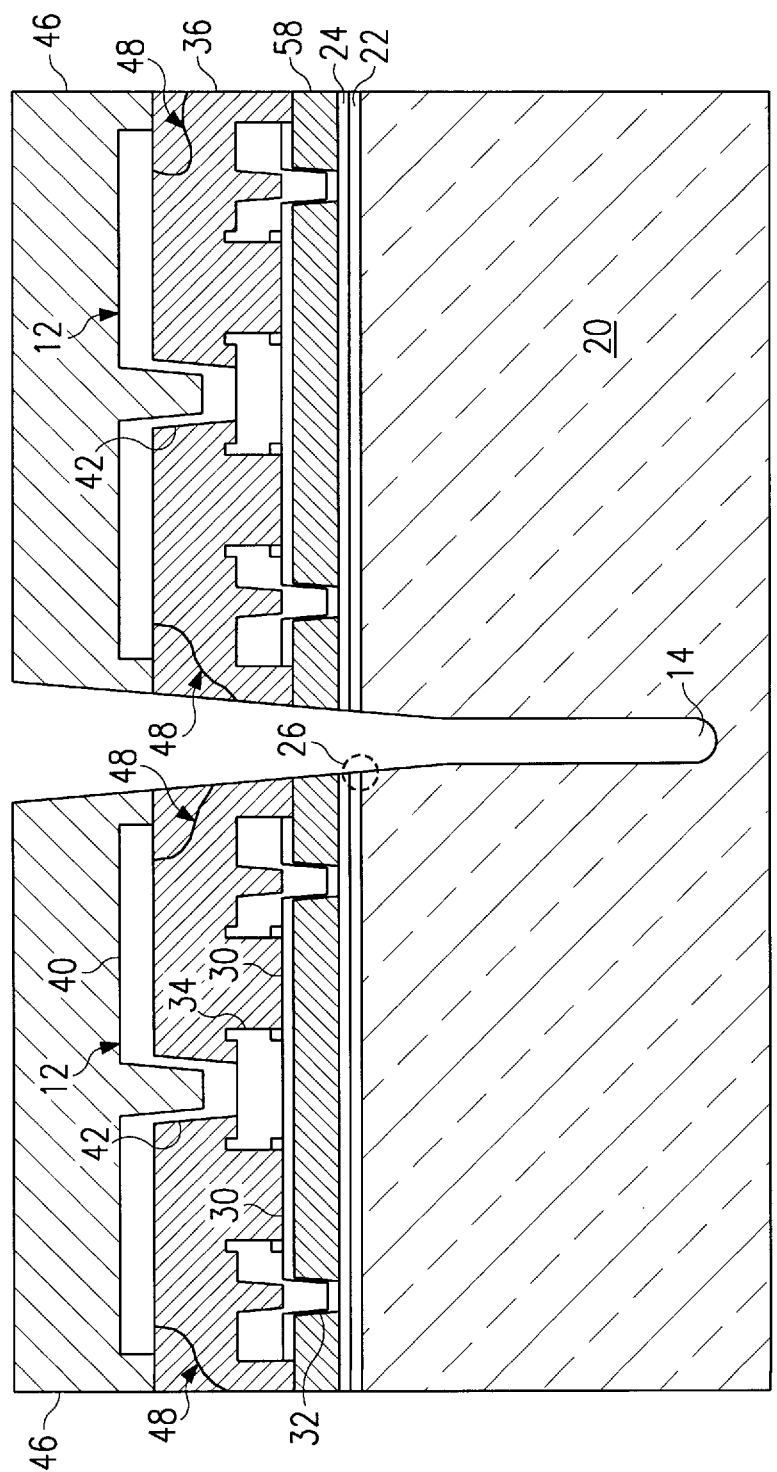
FIG. 1A is a side sectional view of a conventional partially fabricated micromechanical device whereby a top and middle spacer layer of photoresist are not compatible with one another, with microscopic cracks formed in the middle layer which allows a strong solution of hydrofluoric acid to permeate the upper protective photoresist layer and damage the buried micromechanical structure.

Referring now to FIG. 1A, there is generally shown at 10 a cross section of a partially fabricated wafer having several partially fabricated micromechanical monolithic devices 12 separated from one another by a kerf 14. By way of example and for purposes of illustration of the present invention, the micromechanical devices 12 are shown as partially fabricated digital micromirrors devices (DMDs) such as those manufactured by Texas Instruments Incorporated of Dallas, Tex.. The DMDs 12 are comprised of an area array of micromirrors fabricated by sequentially depositing conductive materials over patterned space layers and then patterning the materials to form torsion hinges, support posts, yokes and pixel mirrors, these structures being formed using conventional semiconductor processes and spaced from one another by a plurality of UV-cured photoresist layers. For purposes of describing and understanding the present invention, there is shown a silicon wafer substrate 20, CMOS addressing circuitry 22 covered with a thin protective layer of oxide 24, and a first or lowermost spacer layer of UV-cured photoresist 26. A torsion hinge 30 supported by a pair of support posts 32 is shown fabricated over this lowermost spacer layer of photoresist 26. A middle spacer layer of photoresist 36 is shown deposited over this post, hinge and yoke structure. An elevated mirror 40 and associated mirror support post 42 are fabricated upon this middle spacer layer of photoresist 36. A top protective layer of photoresist shown at 46 is deposited over these partially fabricated micromechanical structures 12, and together with the middle layer of photoresist 36 encapsulates the pixel mirrors 40. For a detailed discussion of fabricating the micromechanical structure 12, cross reference is made to commonly assigned co-pending patent application Ser. No. 08/424,021 entitled "Active Yoke Hidden Hinge Digital Micromirror Device", the teachings incorporated herein by reference.

Figure 1B:
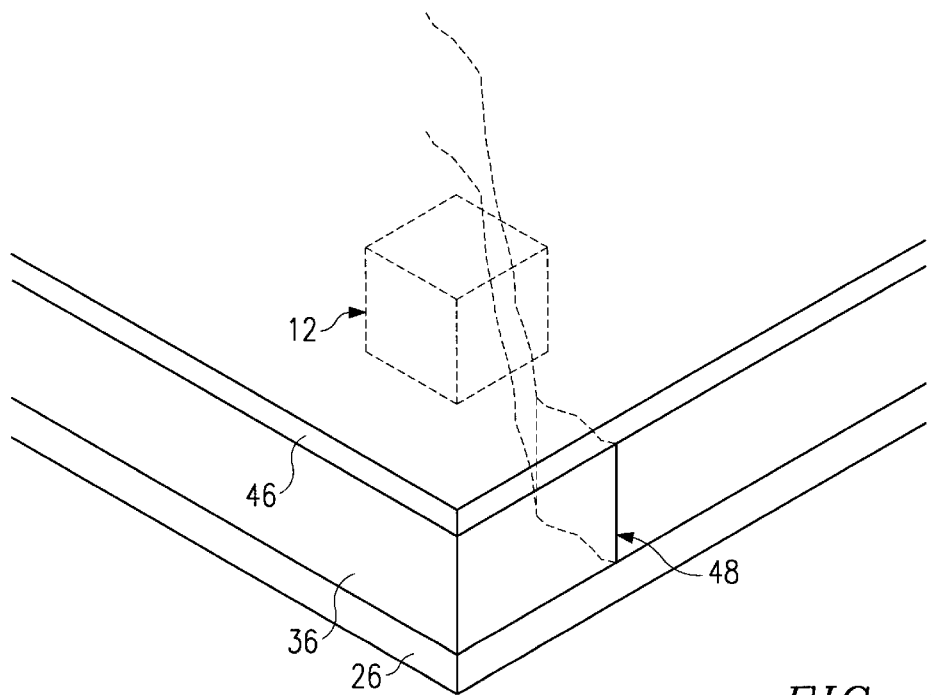
FIG. 1B is a pictorial illustration of the conventional partially fabricated micromechanical device of FIG. 1A, illustrating the microscopic cracks formed in the middle layer caused by resist incompatibility.

Conventionally, the top or protective layer of photoresist 46 is cured at a lower temperature than the curing temperature of the photoresist layers 26 and 36 because if the previous cure temperature is exceeded, outgassing and thermal stress may be induced. The temperature profiles used during the photoresist curing steps are limited to avoid damage to the micromechanical structure 12 encapsulated therewithin. In conventional devices, when the top layer of photoresist 46 and the middle layer of photoresist 36 are formed of incompatible materials, side effects or defects are formed at the interface, or within these layers, typically in layer 36 generally shown at 48. These defects or side effects can include, but without limitation to, microscopic cracking, bubbling or swelling. The formation of these microscopic cracks 48 in the photoresist layer 36 is illustrated in FIG. 1B. After a partial-saw process to separate the partially fabricated micromechanical structures from one another, prior to subsequent processing, the hydrofluoric acid (HF) solution typically permeates through this defective region 48 and damages the encompassed micromechanical structure, such as mirror 40. Moreover, the region of the CMOS layer proximate the kerf that continuously dislodges oxide particles proximate the kerfs, even after a wet acid etch clean-up, remains if only a weak HF solution is used.

As will now be described according to the preferred embodiment of the present invention, these defects or side effects at region 48 are avoided so that a very strong hydrofluoric acid solution can be utilized after the partial-saw process to substantially remove particles and debris residing on the wafer surface and in the saw kerf. The strong HF solution also removes the exposed damaged CMOS surface proximate the kerfs to avoid subsequent generation of oxide particles.

Figure 2:
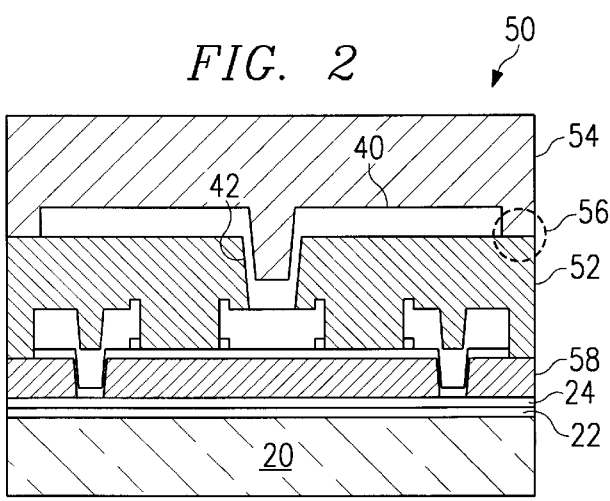
FIG. 2 is also a cross section of a partially fabricated micromechanical device according to the present invention, whereby the middle spacer layer of photoresist is compatible with the top and bottom layer such that the photoresist layers are free of defects or side effects, allowing a very strong solution of hydrofluoric acid to be utilized during the post-saw wafer clean up process.

Referring now to FIG. 2, there is shown at 50 a partially fabricated micromechanical device according to the preferred embodiment of the present invention. Device 50 is fabricated much the same way as device 10 is fabricated. However, the material of the middle spacer layer of photoresist 52 is chosen to be compatible with the top or protective layer of photoresist 54. That is to say, the two layers of photoresist 52 and 54 are selected such that deposition of the top layer 54 does not induce defects or side effects in the lower layer of photoresist 52 at the interface thereof, shown as region 56. In addition, the photoresist material for middle layer 52 is also chosen to be compatible with the lower photoresist spacer layer 58 to avoid inducing defects or side effects between or in these layers. Thus, a strong solution of buffered hydrofluoric acid having a concentration of at least 1%, and preferably 6%, can be utilized to remove post-saw debris and particles, and without damage to the underlying micromechanical structure. Moreover the strong HF solution removes about 1–2 microns of the CMOS layer proximate the kerf, which in conventional devices has been a continuous source of oxide particles, even after the weak wet acid etch clean-up process.

In the preferred embodiment of the present invention, the middle spacer layer of photoresist 52 is identified as part number PFI26B8, made by Sumitomo Chemical America, and the top layer or protective layer of photoresist 54 is identified as Shipley resist #1813. Preferably, the lowermost layer 58 is identified as PFRIX710-D75, made by JSR MicroElectronics.

In an alternative preferred embodiment of the present invention, the middle layer of photoresist 52 is identified as PFRIX300-D75, manufactured by JSR MicroElectronics, and the top layer of photoresist 54 is comprised of PFRIX710-D75 manufactured by JSR MicroElectronics. Preferably, the top layer of photoresist layer 54 is comprised of the same material as the lower most layer of photoresist layer 58 because of process simplification, i.e. using 2 types of photoresist instead of 3.

The thickness of the photoresist layers are preferably as follows. The lowermost layer of photoresist 58 preferably has a thickness of about 1 micron. The middle layer of photoresist 52 preferably has a thickness of about 2 microns, and the top layer of photoresist 54 preferably has a thickness of between 1 and 2 microns. The thickness of these layers depend on viscosity, processing parameters, and cure requirements.

Figure 3:
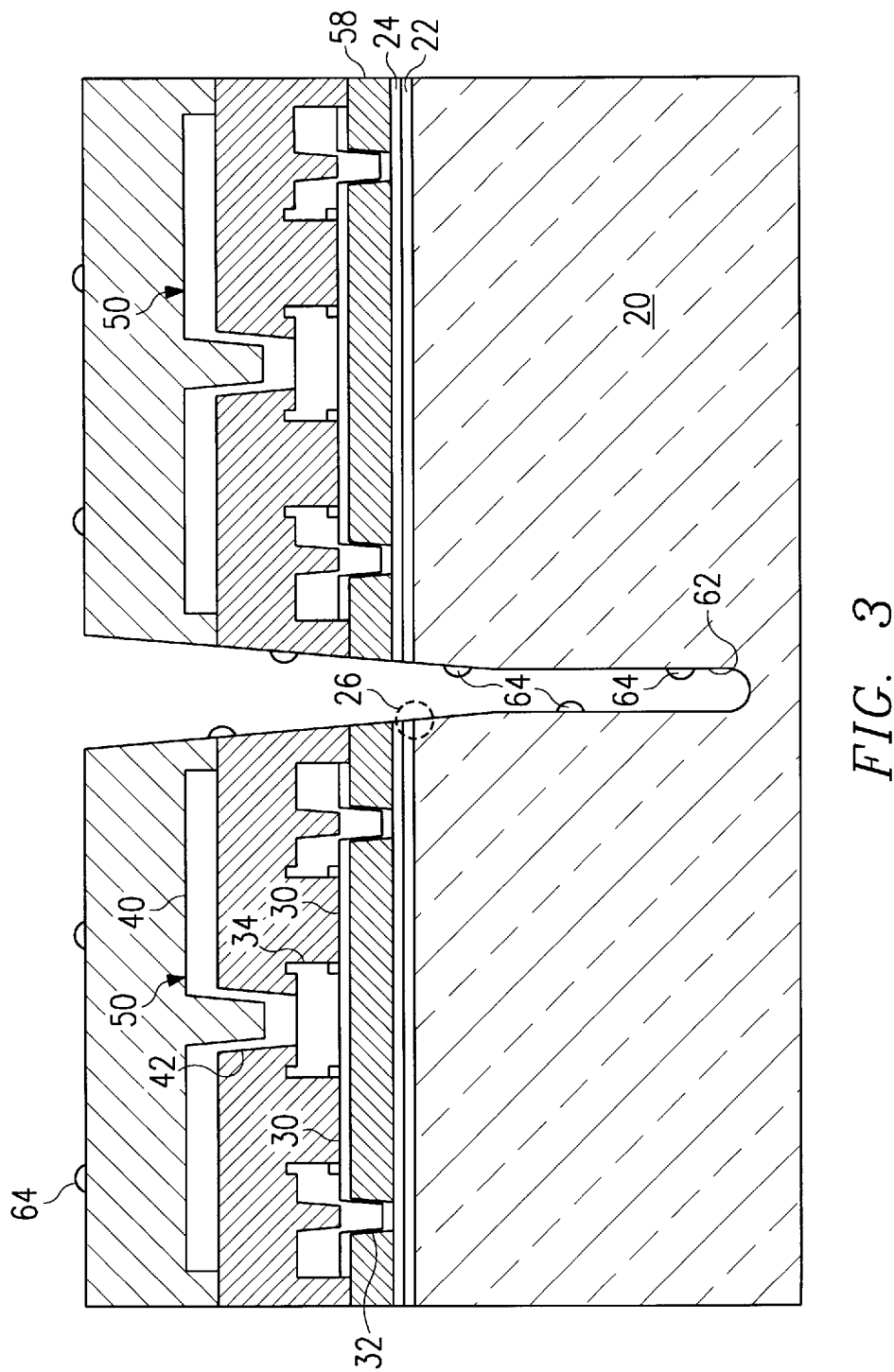
FIG. 3 is a cross section of a partially fabricated wafer including a pair of the partially fabricated micromechanical devices separated by a kerf formed along the streets during a partial-saw process, whereby particles and debris are seen to reside within the kerf and on the wafer surface.

Referring now to FIG. 3, there is shown the partially fabricated wafer including a pair of the partially fabricated micromechanical devices 50 separated from one another by a saw kerf 62 formed along the streets separating these micromechanical devices. During the partial-saw process, debris shown at 64 is formed and becomes positioned at the wafer surface and in the saw kerf 62. Some of the particles are oxide particles formed by sawing the CMOS layer 22.

Figure 4:
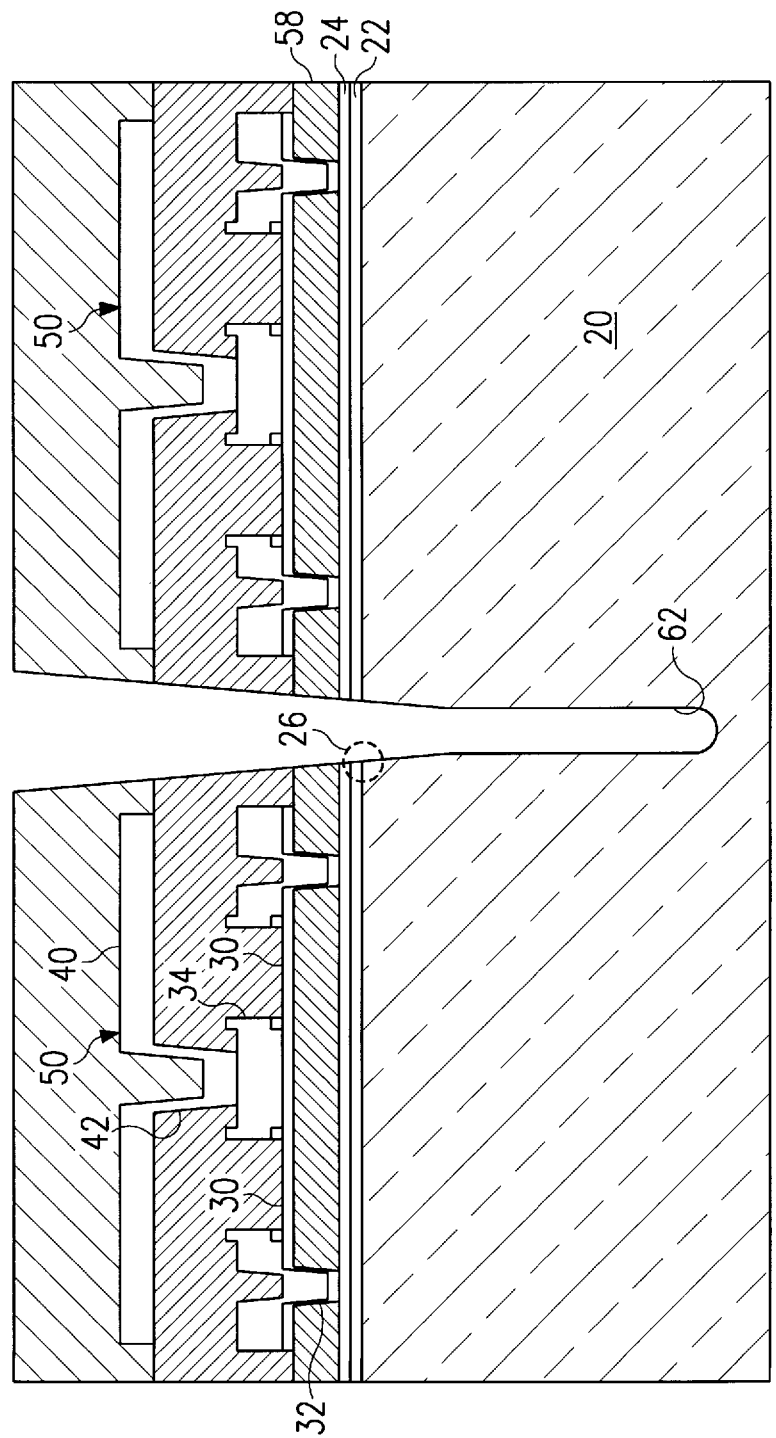
FIG. 4 is the partially fabricated wafer shown in FIG. 3 after a clean-up process utilizing a very strong solution of hydrofluoric acid whereby the partially fabricated micromechanical devices have compatible spacer layers of photoresist material according to the preferred embodiment of the present invention.

Referring now to FIG. 4, by carefully selecting the composition of bottom layer 58, the middle layer 52, and top layer 54 of photoresist as illustrated in FIG. 2, a solution of substantially strong concentration of hydrofluoric acid in combination with deionized water can be utilized to cleanse the wafer surface and kerf to thoroughly remove the debris 64. Importantly, this debris is thoroughly removed with the strong solution of hydrofluoric acid without damaging the partially fabricated micromechanical devices 50. Again, this is because there is no damage to any of the photoresist layers 52, 54 or 58. Therefore, the strong solution of hydrofluoric acid will not permeate through any damaged area, and the underlying micromechanical structure remains unaffected during the cleansing process. In conventional devices, when the materials of the bottom, middle and top layers of the photoresist 58, 52 and 54, respectively, were not carefully selected, a buffered hydrofluoric acid solution comprised of no more than about 0.05% buffered acid could cause damage in the underlying or encompassed micromechanical structure.

According to the present invention, the use of the 6% HF solution also derives benefits by removing about 1–2 microns of the damaged CMOS oxide stack at region 68. The damage of the CMOS layer at 68 is caused by the saw process. By removing the damaged portion of the CMOS layer proximate kerf 62, oxide particles will not be continuously dislodged after the wet-acid etch clean-up process. This, inturn, increases the yield of the micromechanical devices. Therefore, ability to use the strong solution of HF derives two important benefits.

Figure 5:
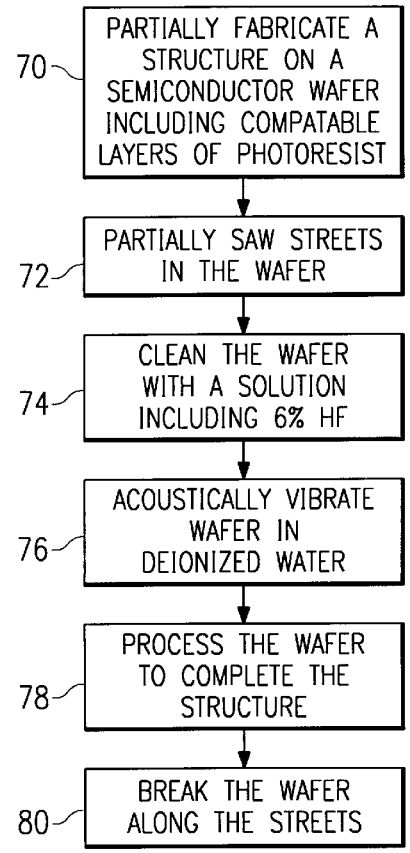
FIG. 5 is a flow diagram of the method according to the preferred embodiment of the present invention to fabricate and clean the partially fabricated wafer.

Turning now to FIG. 5, there is shown a method of fabricating a monolithic micromechanical structure from a wafer according to the preferred embodiment of the present invention. At step 70, a micromechanical structure is partially fabricated on a semiconductor wafer 20, as shown in FIG. 2. This micromechanical structure is fabricated using techniques such as those described in commonly assigned U.S. patent application Ser. No. 08/424,021 entitled "Active Yoke Hidden Hinge Digital Micromechanical Device", the teachings of which are incorporated herein by reference. According to the preferred embodiment of the present invention, the middle layer 52 of photoresist and the top layer of photoresist 54 are chosen as previously described to avoid any damage or side effects to the middle layer of photoresist at the interface of the two layers.

At step 72, the wafer is sawn along the streets between micromechanical devices 50 to form the kerfs 62, shown in FIGS. 3 and 4.

At step 74, the wafer is cleaned with a strong solution of hydrofluoric acid and deionized water for 1–2 minutes. Preferably, 6% buffered hydrofluoric acid is utilized. By rinsing the partially fabricated wafer, debris including oxide particles is removed, as shown in FIG. 4. In addition, 1–2 microns of the damaged CMOS layer stack proximate the kerfs 62 is removed.

At step 76, the cleansed wafer is acoustically vibrated in deionized water. Preferably, this is done by a megasonic process.

At step 78 the wafer is further processed to complete the structure, which includes the removal of all photoresist spacer layers including layer 52, 54 and 58 shown in FIG. 2. Preferably, these layers of photoresist are removed using a dry plasma ash process. This ash process preferably utilizes two or three gases at different rates, and at RF settings that gently remove the photoresist layers. Preferably, an $O_2$ gas in combination with a small amount of $NF_3$ gas is utilized, and possibly a portion of argon gas.

At step 80, the wafer is then broken along the kerfs 62 to form completed individual micromechanical structures which are later hermetically sealed to form a completed DMD device.

In summary, the present invention comprises a method of fabricating a monolithic device, particularly a micromechanical device, from a wafer with reduced particles. By carefully selecting the composition of the various spacer and protective layers of photoresist used to fabricate the micromechanical structure, damage to the underlying micromechanical structure is avoided during a wet chemical etch clean-up process. According to the present invention, a very strong solution of hydrofluoric acid can be utilized to thoroughly cleanse the wafer after a partial saw process to remove particles including oxide particles, and remove the damaged surface of the CMOS layer proximate the kerfs. The chosen layers of photoresist are compatible to avoid bubbling, cracking, swelling, etc of the layers of photoresist, particularly the second or middle layer.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications. For instance, the present invention is well suited to fabricate other monolithic devices which are sensitive to particles including, but not limited to, CCD devices, sensors and accelerometers.

We claim:

1. A method of fabricating a monolithic device from a wafer, comprising the steps of:
    a) partially fabricating the device by depositing a first and second layer of photoresist on the wafer, wherein said first and second layers are compatible with each other, with a structure disposed therebetween;
    b) partially sawing the wafer to form kerfs; and
    c) cleansing the device with a solution of buffered hydrofluoric acid (HF) having a concentration of at least 1%, wherein said compatible first and second photoresist layers prevent the HF solution from permeating the second photoresist layer and damaging the structure.

2. The method as specified in claim 1, wherein the device is a micromechanical device, and the structure defined between the first and the second photoresist layer is a micromechanical structure.

3. The method as specified in claim 1, wherein the second layer of photoresist is deposited such that the first and second layers of photoresist are free of microscopic cracks.

4. The method as specified in claim 1 wherein the first and the second photoresist layers are comprised of two different types of photoresist.

5. The method as specified in claim 1 wherein the first and the second layers of photoresist are cured and comprise a bottom and a top layer, respectively, whereby the top layer is cured at a lower temperature than a cured temperature of the bottom layer of photoresist.

6. The method as specified in claim 1 further comprising the step of removing the first and the second layers with a plasma ash process.

7. The method as specified in claim 1 wherein the wafer includes a layer of CMOS, wherein the device is cleansed with the HF solution to remove a portion of the CMOS layer proximate the kerf.

8. The method as specified in claim 7 wherein at least 1 micron of the CMOS layer is removed proximate the kerf.

9. The method as specified in claim 7, wherein the entire damaged portion of the CMOS layer generated by the partial saw process proximate the kerf is removed by the HF solution.

10. The method as specified in claim 9 wherein said solution comprises about 6% buffered HF acid.

11. The method as specified in claim 1, further comprising the step of acoustically vibrating the device in deionized water, and then separating the wafer along the kerfs.

12. The method as specified in claim 1, wherein the device is partially fabricated in the step a) with a bottom, a middle and a top layer of photoresist, whereby the middle layer is compatible with both the top and the bottom layer of photoresist.

* * * * *